(12) United States Patent
Yu et al.

(10) Patent No.: US 11,954,254 B2
(45) Date of Patent: Apr. 9, 2024

(54) MINIATURIZED ON-SKIN ELECTROTACTILE APPARATUS

(71) Applicant: City University of Hong Kong, Hong Kong (CN)

(72) Inventors: Xinge Yu, Hong Kong (CN); Kuanming Yao, Hong Kong (CN); Jingkun Zhou, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 162 days.

(21) Appl. No.: 17/660,216

(22) Filed: Apr. 22, 2022

(65) Prior Publication Data

US 2023/0341937 A1 Oct. 26, 2023

(51) Int. Cl.
*H04W 4/80* (2018.01)
*G06F 3/01* (2006.01)
*G06F 3/041* (2006.01)
*H05K 1/02* (2006.01)

(52) U.S. Cl.
CPC .............. *G06F 3/016* (2013.01); *G06F 3/014* (2013.01); *G06F 3/015* (2013.01); *G06F 3/04164* (2019.05); *H04W 4/80* (2018.02); *H05K 1/028* (2013.01)

(58) Field of Classification Search
CPC ....................................................... G06F 3/016
See application file for complete search history.

(56) References Cited

U.S. PATENT DOCUMENTS

| 9,778,746 B2* | 10/2017 | Keller ...................... G08B 6/00 |
| 2014/0139328 A1* | 5/2014 | Zellers .................... G06F 3/041 |
| | | 340/407.2 |
| 2021/0052845 A1* | 2/2021 | Chen ....................... G08B 6/00 |

OTHER PUBLICATIONS

M. Ying, A.P. Bonifas, N. Lu, Y. Su, R. Li, H. Cheng, A. Ameen, Y. Huang, J.A. Rogers, Silicon nanomembranes for fingertip electronics, Nanotechnology. 23 (2012) 344004.
A. Withana, D. Groeger, J. Steimle, Tacttoo: A thin and feel-through tattoo for on-skin tactile output, in: UIST 2018—Proc. 31st Annu. ACM Symp. User Interface Softw. Technol., 2018: pp. 365-378.

(Continued)

*Primary Examiner* — Joseph H Feild
*Assistant Examiner* — Pameshanand Mahase
(74) *Attorney, Agent, or Firm* — S&F/WEHRW

(57) ABSTRACT

An electrotactile apparatus has an electrode-array unit and a driver unit for generating a haptic feedback to a user. The electrode-array unit uses electrodes to electro-stimulate the user's skin with pulsed voltage signals generated by the driver unit, inducing excitation currents flowing in the user to generate the haptic feedback. The driver unit is self-powered or wirelessly powered for supporting untethered electrotactile stimulation to the user. A common counter electrode installed on the driver unit contacts the user's skin and collects the excitation currents returned from the user. Advantageously, the common counter electrode is located on an outer surface of the driver unit and the driver unit is substantially flexible, facilitating the common counter electrode to seamlessly contact the user's skin for achieving a stable electrode-skin interface while positioning the driver unit as a whole on the user's skin to provide untethered virtual touching experience to the user.

20 Claims, 5 Drawing Sheets

(56) References Cited

OTHER PUBLICATIONS

A. Akhtar, J. Sombeck, B. Boyce, T. Bretl, Controlling sensation intensity for electrotactile stimulation in human-machine interfaces, Sci. Robot. 3 (2018) eaap9770.

B. Xu, A. Akhtar, Y. Liu, H. Chen, W.H. Yeo, S. Park, B. Boyce, H. Kim, J. Yu, H.Y. Lai, S. Jung, Y. Zhou, J. Kim, S. Cho, Y. Huang, T. Bretl, J.A. Rogers, An Epidermal Stimulation and Sensing Platform for Sensorimotor Prosthetic Control, Management of Lower Back Exertion, and Electrical Muscle Activation, Adv. Mater. 28 (2016) 4462-4471.

Y. Shi, F. Wang, J. Tian, S. Li, E. Fu, J. Nie, R. Lei, Y. Ding, X. Chen, Z.L. Wang, Self-powered electro-tactile system for virtual tactile experiences, Sci. Adv. (2021) 1-11.

\* cited by examiner

MINIATURIZED ON-SKIN ELECTROTACTILE APPARATUS

ABBREVIATIONS

AR Augmented reality
BLE Bluetooth Low Energy
EMI Electromagnetic interference
FPCB Flexible printed circuit board
MUX Multiplexer
PAAm Poly-acrylamide
PCB Printed circuit board
PEDOT:PSS Poly(3,4-ethylenedioxythiophene) polystyrene sulfonate
PI Polyimide
VR Virtual reality
XR Mixed reality

FIELD OF THE INVENTION

This invention relates generally to a substantially-flexible, miniaturized electrotactile apparatus mountable on a skin of a user for electro-stimulating the user's skin to provide a haptic feedback to the user.

BACKGROUND

In blooming VR, AR and XR industries, providing vivid tactile feedbacks to a user can make touching or feeling objects in a virtual world (viz., Metaverse) more verisimilar, improving immersive experience of the user. A haptic-feedback device realized with a large-area electromagnetic-actuator array can be used to provide haptic feedback to the user. However, this device requires complicated and bulky mechanical structures and thus is large and quite heavy, adding burden to the user and reducing the user's freedom of movement. To provide truly immersive VR/AR experience to the user, the haptic-feedback device is required to be smaller, thinner and lighter to reduce foreign-objects feeling for the user so as to allow the user to focus more on the virtual-touching feeling. Besides, the device is preferred to be realized in one piece and to operate independently so as to avoid the user from being tethered or limited by wires or cables.

To reduce size and thickness of the haptic-feedback device, electrotactile stimulation is preferable over mechanical actuation in realizing the device since the former approach only requires thin electrodes attached to the user's skin with an application of pulsed currents through the body. Injected charge directly activates the mechanoreceptors-related afferent nerves to create haptic sensation at the user. Compared to other tactile-sensation generation mechanisms, i.e. mechanical actuation (electromagnetic, piezoelectric, pneumatic and hydraulic) and thermal stimulation (Joule heating, thermoelectric and microfluidic), electrotactile stimulation is free of moving structures or fluidic channels and thus can be made very thin at the skin-contacting interface, which allows the device to be made smaller and more portable or wearable. In addition, the mechanism of electrotactile stimulation, the design and optimization of stimulating waveforms and frequencies, and techniques for constant sensation intensity control have been widely studied. The styles, structures, functionalities and electrodes materials of electrotactile feedback devices have also evolved and varied a lot for adaptation in various application scenarios, e.g., PCB touch pads for texture rendering, screen-integrated arrays for electrotactile display, arm bands or arm-integrated patches, electrode arrays on tongue for oral display, etc. Wearable electrotactile devices such as silicone finger-tubes and tattoo-like ultrathin films for fingertip or arm stimulation are realized as thin, soft, light-weighted formats that can be attached conformally to the skin and induce little extra feeling to the user.

However, a high voltage is often required by an electrotactile device for generating high-voltage pulsed signals. As such, additional power sources and signal generators are needed. These additional elements are usually rigid, bulky and non-portable, meaning that the electrotactile device is required to connect to external, heavy equipment through electrical wires or cables. It disadvantageously limits the range of user's activity and causes uncomfortable bound feelings to the user. There is a need in the art for an untethered electrotactile haptic-feedback device to provide vivid, completed and immersive virtual-touching feelings in VR/AR scenarios.

SUMMARY OF THE INVENTION

An aspect of the present invention is to provide an on-skin electrotactile apparatus for stimulating a first area of skin of a user to provide a haptic feedback to the user. Advantageously, the apparatus is miniaturized and does not need to install an external electrical cable to draw in external electrical power such that untethered virtual touching experience is achievable.

The apparatus comprises an electrode-array unit and a driver unit. The electrode-array unit comprises a plurality of electrodes for electro-stimulating the first area of skin to generate the haptic feedback. The driver unit is configured to generate a plurality of pulsed voltage signals for driving the plurality of electrodes to thereby induce a plurality of excitation currents flowing into the user. The driver unit is further configured to be self-powered or wirelessly powered for avoiding installing an external electrical cable, such as a power cord, to draw in external electrical power to thereby support untethered electrotactile stimulation to the user. In addition, the driver unit includes a common counter electrode arranged to contact a second area of skin of the user for collecting the plurality of excitation currents returned from the user. Particularly and advantageously, the common counter electrode is located on an outer surface of the driver unit and the driver unit is substantially flexible, facilitating the common counter electrode to seamlessly contact the second area of skin for achieving a stable electrode-skin interface while positioning the driver unit as a whole on the second area of skin to provide untethered virtual touching experience to the user.

Preferably, the driver unit further includes a rechargeable battery, a power management module, a high-voltage booster module, a high-voltage MUX, a MCU and a FPCB. The rechargeable battery is used for providing a battery-supplied electrical voltage. The power management module is used for regulating the battery-supplied electrical voltage to a regulated voltage. The high-voltage booster module is used for boosting up the regulated voltage to yield a boosted voltage. The high-voltage MUX is used for controllably switching on and off the boosted voltage to generate the plurality of pulsed voltage signals. The MCU is configured to at least control the high-voltage MUX in switching the boosted voltage for generating an individual pulsed voltage signal with a desired pulse frequency and a desired duty cycle. The FPCB is mounted with at least the power management module, the high-voltage booster module, high-voltage MUX and MCU.

Preferably, the driver unit further includes a wireless charging module for recharging the rechargeable battery. The wireless charging module is mounted on the FPCB. In certain embodiments, the wireless charging module is compliant to a QI wireless power transfer standard.

Preferably, the FPCB is folded to divide the FPCB into a first FPCB portion and a second FPCB portion such that the wireless charging module and the MCU are located on the first FPCB portion and the second FPCB portion, respectively. A magnetic shielding layer is sandwiched between the first FPCB portion and the second FPCB portion for reducing magnetic-field interference generated by the wireless charging module to the MCU during recharging the rechargeable battery.

Preferably, the rechargeable battery is mounted on the FPCB. The rechargeable battery may be flexible or rigid.

Preferably, the driver unit further includes a current control module controllable by the MCU for monitoring and limiting a return current received by the common counter electrode from the user to avoid the user from getting an electric shock. The return current is a sum of respective excitation currents in the plurality of excitation currents.

Preferably, the common counter electrode is a flexible patch composed of a conductive polymer. The conductive polymer may be conductive hydrogel, PEDOT:PSS, or silicone embedded with conductive materials.

Preferably, the driver unit further includes a wireless communication transceiver for communicating with an external device. The wireless communication transceiver is communicable with the MCU for enabling the MCU to communicate with the external device. In certain embodiments, the wireless communication transceiver is compliant to a BLE specification.

In certain embodiments, the MCU and the wireless communication transceiver are integrated into a single package.

In certain embodiments, an individual electrode in the plurality of electrodes is soft and is composed of a conductive polymer. The conductive polymer may be conductive hydrogel, PEDOT:PSS, or silicone embedded with conductive materials.

In certain embodiments, the electrode-array unit further comprises an elastomer encapsulating layer, a plurality of conductive traces, a protective layer, a supporting layer, and an elastomer substrate layer. The elastomer encapsulating layer is arranged to contact the first area of skin and is mounted with the plurality of electrodes for positioning the plurality of electrodes on a plurality of preselected locations of the first area of skin. The elastomer encapsulating layer is flexible, extensible and electrically insulating. The plurality of conductive traces is used for transmitting the plurality of pulsed voltage signals from outside the electrode-array unit to the plurality of electrodes. The supporting layer and protective layer are positioned such that the plurality of conductive traces is sandwiched between the supporting layer and the protective layer. The protective layer is adjacent the elastomer encapsulating layer. Both the supporting layer and the protective layer are electrically insulating. The elastomer substrate layer is used for offering protection to the elastomer encapsulating layer, the protective layer, the plurality of conductive traces and the supporting layer when the electrode-array unit is put on the first area of skin. The supporting layer is positioned adjacent the elastomer substrate layer. The elastomer substrate layer is flexible, extensible and electrically insulating.

In certain embodiments, the elastomer encapsulating layer is composed of silicone, rubber or a stretchable material.

In certain embodiments, the plurality of conductive traces is composed of metal, graphene, carbon nanotube or conductive polymer.

In certain embodiments, the supporting layer and protective layers are made of PI or parylene C.

In certain embodiments, the elastomer substrate layer is composed of silicone, rubber or a stretchable material.

The apparatus may further comprise a multichannel connector arranged to connect the driver unit and the electrode-array unit for transmitting the plurality of pulsed voltage signals from the driver unit to the plurality of electrodes.

Other aspects of the present invention are disclosed as illustrated by the embodiments hereinafter.

Skilled artisans will appreciate that elements in the figures are illustrated for simplicity and clarity and have not necessarily been depicted to scale.

DETAILED DESCRIPTION

As used herein in the specification and appended claims, the term "avoid" or "avoiding" refers to any method to partially or completely preclude, avert, obviate, forestall, stop, hinder or delay the consequence or phenomenon following the term "avoid" or "avoiding" from happening. The term "avoid" or "avoiding" does not mean that it is necessarily absolute, but rather effective for providing some degree of avoidance or prevention or amelioration of consequence or phenomenon following the term "avoid" or "avoiding".

As used herein, being "flexible" of an object means that the object is capable of being flexed or bent without breaking.

As used herein, being "substantially flexible" of an object means that the object is largely able to bend without breaking.

Disclosed herein is an on-skin electrotactile apparatus for electro-stimulating a user on his or her skin to provide a haptic feedback to the user. The haptic feedback causes a virtual tactile sensation at the user. Tactile sensation of a person generally refers to feeling of touch in roughness, texture, pressure, vibration, etc. as experienced or perceived by the person. Advantageously, the disclosed apparatus is miniaturized and does not need to install an external electrical cable to draw in external electrical power such that untethered virtual touching experience is achievable.

Since fingers are sensitive in touch sensing and form a richest source of tactile feedback, the disclosed apparatus is particularly useful for stimulating a hand of the user in generating a virtual touching feeling for VR, AR or XR applications. Details of the disclosed apparatus will be provided by illustrating an exemplary apparatus designed for hand stimulation. However, the present invention is not limited only to hand-stimulation applications. Based on the details of various embodiments of the apparatus as disclosed herein, those skilled in the art may design and implement an on-skin electrotactile apparatus for stimulating any part of the user's body.

Figure 1:
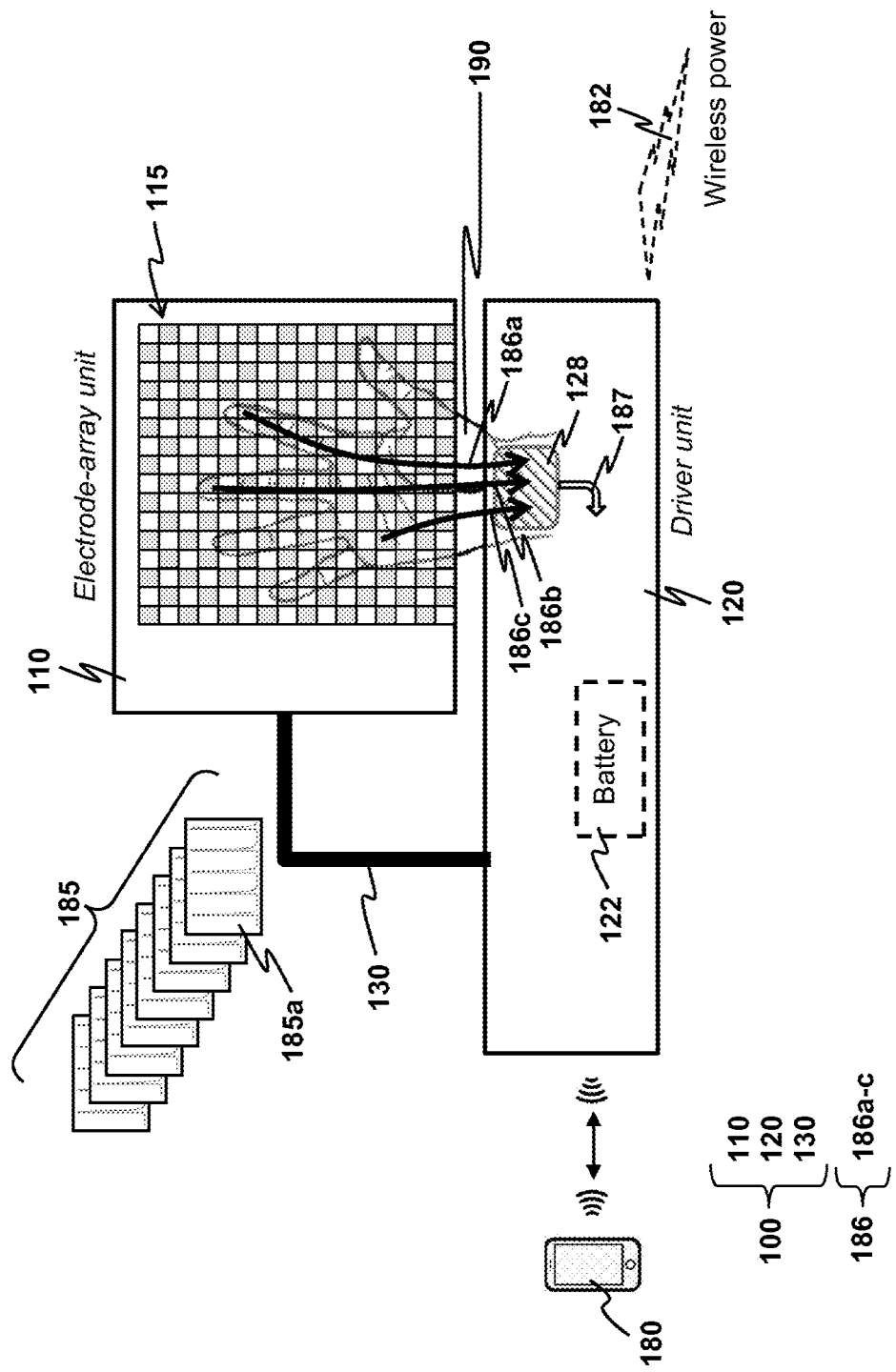
FIG. 1 depicts a schematic diagram of an on-skin electrotactile apparatus in accordance with an exemplary embodiment of the present invention, where the apparatus includes an electrode-array unit comprising a plurality of electrodes for electro-stimulating a skin of a user, and a driver unit configured to generate a plurality of pulsed voltage signals for driving the plurality of electrodes to thereby induce a virtual tactile sensation at the user.
Figure 3:
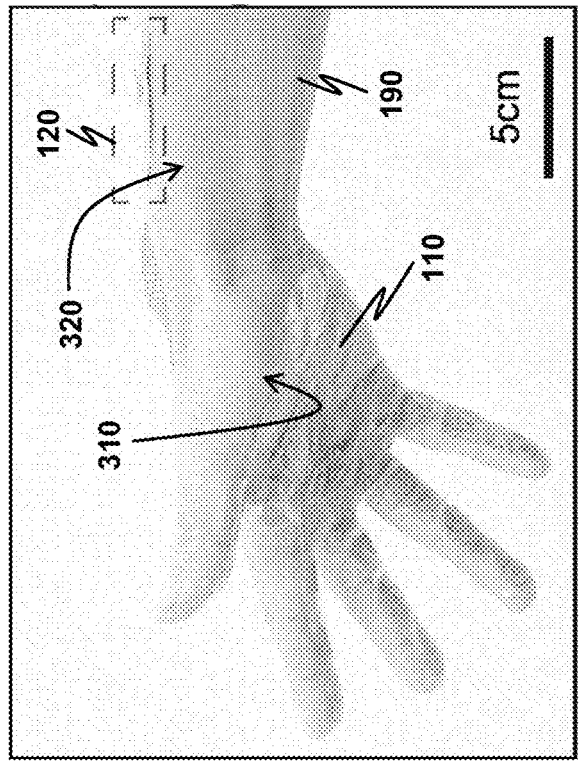
FIG. 3 depicts a situation that the apparatus is worn on a hand during operation.
Figure 2:
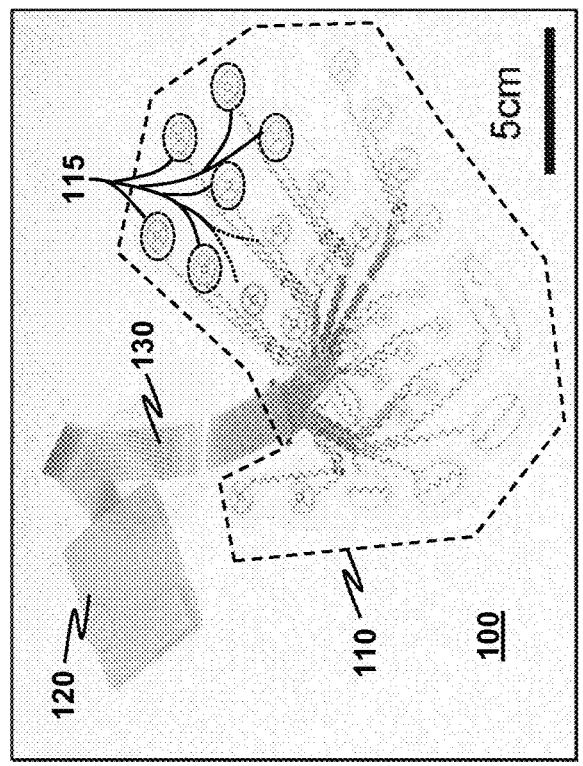
FIG. 2 depicts a prototype of the apparatus usable in practical applications.

The disclosed apparatus is exemplarily illustrated hereinafter with the aid of FIGS. 1-3. FIG. 1 depicts a schematic diagram of an exemplary on-skin electrotactile apparatus 100 for stimulating a first area 310 of skin of a hand 190 to provide a haptic feedback to the user. While the schematic diagram of FIG. 1 is drawn for conveniently illustrating the apparatus 100, FIG. 2 depicts a prototype of the apparatus 100 for practical applications. FIG. 3 depicts a practical situation that the apparatus 100 is worn on the hand 190 of the user during operation.

The apparatus 100 comprises an electrode-array unit 110 and a driver unit 120. The electrode-array unit 110 is arranged to contact the first area 310. In particular, the electrode-array unit 110 comprises a plurality of electrodes 115 for electro-stimulating the first area 310 of skin to generate the haptic feedback so as to create a virtual tactile sensation at the user. As used in FIGS. 1-3 for illustration purposes, the first area 310 is chosen to be an area of skin on the palmar side of the hand 190. The plurality of electrodes 115 is distributed over a plurality of different locations on the first area 310 of skin, e.g., different finger segments and the palm. The driver unit 120 is configured to generate a plurality of pulsed voltage signals 185 for driving the plurality of electrodes 115 to thereby induce a plurality of excitation currents 186 flowing into the user. The plurality of excitation currents 186 enters into the hand 190 through the plurality of electrodes 115 to generate the virtual tactile sensation. Usually, an individual pulsed voltage signal 185a is a periodic pulsed voltage with a judiciously selected pulse frequency and duty cycle for generating a desired sensation of touching. Advantageously, the driver unit 120 is further configured to be self-powered or wirelessly powered for avoiding installing an external electrical cable to draw in external electrical power, thereby supporting untethered electrotactile stimulation to the user. By self-powering, the driver unit 120 is installed with an internal battery 122, which may be rechargeable or non-rechargeable although a rechargeable battery has some advantages over a non-rechargeable one. Alternative to self-powering, the driver unit 120 may receive wireless power 182. If the driver unit 120 is also installed with the battery 122 that is rechargeable, the received wireless power 182 may be used to recharge the battery 122.

The plurality of pulsed voltage signals 185 generated by the driver unit 120 is transmitted to the electrode-array unit 110 through an electrical connector 130. The electrical connector 130 is a multichannel connector for transmitting multiple pulsed voltage signals. Keeping the electrical connector 130 short is desirable for realizing untethered electrotactile stimulation. Note that after the plurality of excitation currents 186 enters into and passes through the hand 190, a common counter electrode 128 in contact with the user's skin is required to collect the plurality of excitation currents 186 returned from the user to thereby form a return current 187. The return current 187 is a sum of respective excitation currents 186a-c. The return current 187 then returns to the driver unit 120. Denote the skin area on which the common counter electrode 128 collects the return current 187 as a second area 320 of skin of the user. Normally, the first and second areas 310, 320 of skin are positioned in proximity to each other. As demonstrated in FIG. 3, the second area 320 of skin is a region near the wrist, which is close to the palmar side of the hand 190, i.e. the first area 310 of skin. In the apparatus 100, this proximity property is advantageously utilized by embedding the common counter electrode 128 in the driver unit 120. Particularly, the driver unit 120 further includes the common counter electrode 128, and the common counter electrode 128 is located on an outer surface of the driver unit 120.

Since the common counter electrode 128 is an exit point of the return current 187 from the skin, it is undesirable to have a point contact between the common counter electrode 128 and the skin; otherwise an unintended tactile feeling would be felt by the user at the second area 320 of skin. As such, the common counter electrode 128 is usually realized as a patch. Furthermore, a stable electrode-skin interface is required during operating the apparatus 100; an unstable one would unpredictably and occasionally generate unintended tactile feeling at the second area 320 of skin and/or kill intended tactile feeling at the first area 310 due to breaking and making of the contact between the common counter electrode 128 and the skin. Ideally, the stable electrode-skin interface is easier to be maintained over time if the common counter electrode 128 seamlessly contacts the second area 320 of skin, i.e. if the common counter electrode 128 is shaped to follow the curvature of the second area 320 of skin. It is achievable if the common counter electrode 128 is flexible. Note that in the apparatus 100, the common counter electrode 128 is embedded in the driver unit 120 such that the driver unit 120 is integrally formed with the common counter electrode 128. In the apparatus 100, advantageously the driver unit 120 is substantially flexible, facilitating the common counter electrode 128 to seamlessly contact the second area 320 of skin for achieving the stable electrode-skin interface while positioning the driver unit 120 as a whole on the second area 320 of skin to provide untethered virtual touching experience to the user.

To contribute to the substantial flexibility of the driver unit 120, the common counter electrode 128 is a flexible patch.

In certain embodiments, the common counter electrode 128 is composed of a conductive polymer for providing flexibility and electrical conductivity to the common counter electrode 128. The conductive polymer may be a conductive hydrogel. The conductive hydrogel, due to its adhesive property, may also be advantageously used as an adhesive interface between the driver unit 120 and the hand 190.

Other conductive polymers that may be used to form the common counter electrode 128 include PEDOT:PSS, and silicone embedded with conductive materials.

Preferably, the driver unit 120 is configured to wirelessly communicate with an external device 180, e.g., a smartphone, such that electrostimulation commands is obtainable from the external device 180 without requiring an electrical wire to connect to the external device 180. It is desirable for achieving untethered electro-stimulation.

Since the electrode-array unit 110 is intended to contact the first area 310 of skin, generally the electrode-array unit 110 is realized to be flexible or substantially flexible for adapting to the curvature of the first area 310 of skin. Hence, the apparatus 100 is substantially flexible, provided that the multichannel connector 130 is a flexible connector.

Figure 4:
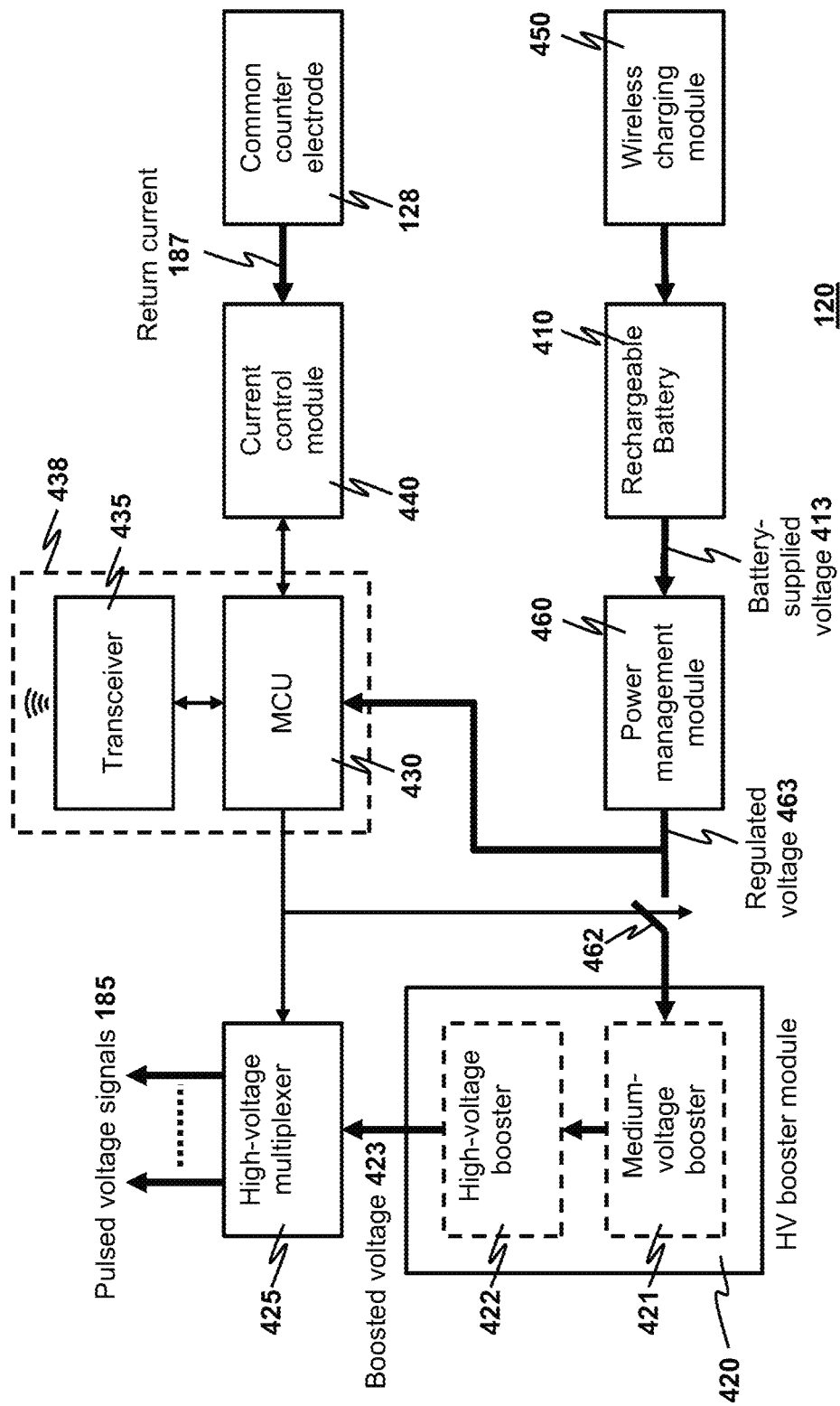
FIG. 4 depicts a block diagram of the driver unit in accordance with certain embodiments of the present invention.
Figure 5:
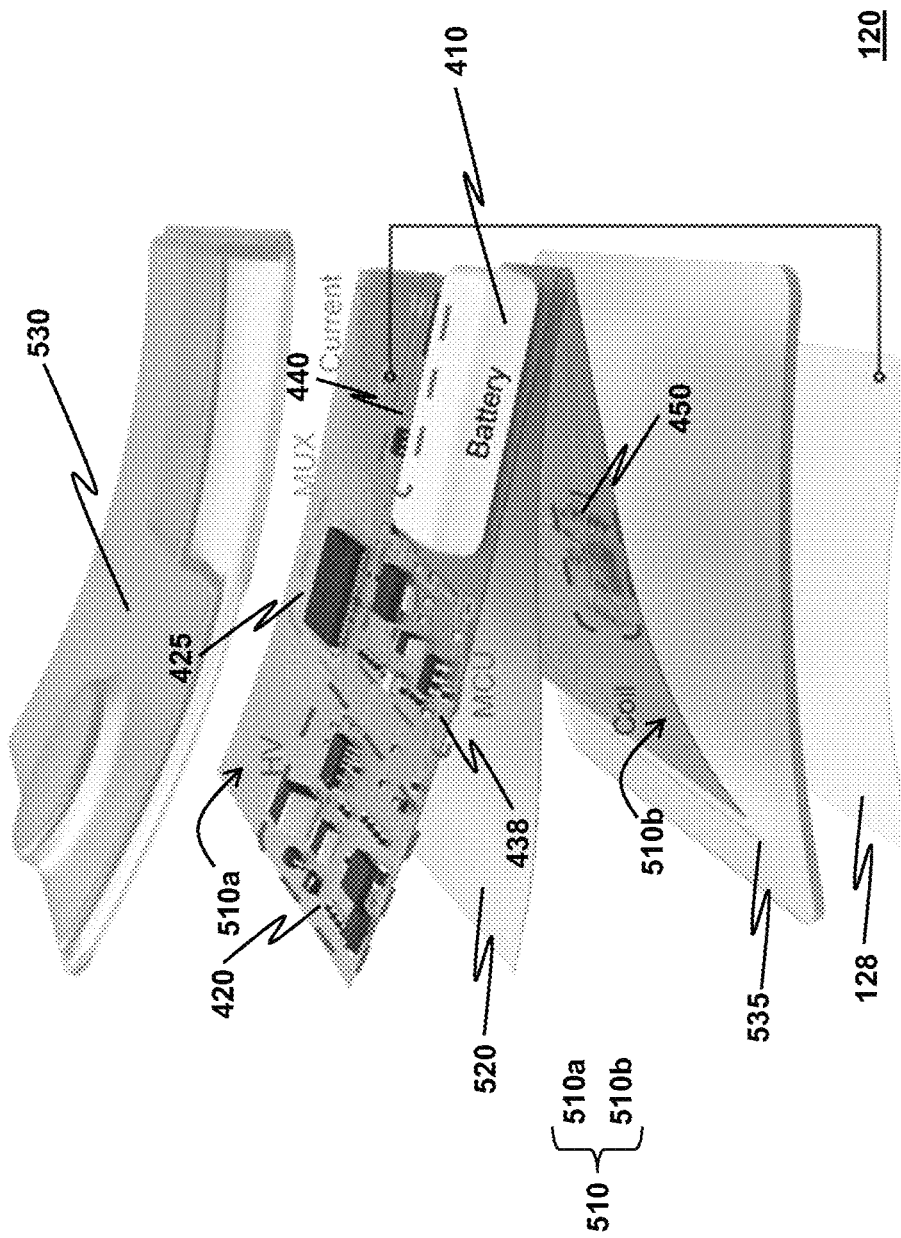
FIG. 5 depicts in exploded view a practical realization of the driver unit of FIG. 4.

Embodiments of the driver unit 120 are illustrated with the aid of FIGS. 4 and 5. FIG. 4 depicts a block diagram of the driver unit 120 and FIG. 5 depicts a practical realization of the driver unit 120 in exploded view, both in accordance with certain embodiments of the present invention.

In addition to the common counter electrode 128, exemplarily the driver unit 120 further includes a rechargeable battery 410 (as one form of the battery 122), a power management module 460, a high-voltage booster module 420, a high-voltage MUX 425 and a MCU 430. Furthermore, advantageously the driver unit 120 further includes a FPCB 510 on which at least the high-voltage booster module 420, the high-voltage MUX 425 and the MCU 430 are mounted. The FPCB 510 is flexible and foldable, contributing to the substantial flexibility of the driver unit 120.

Note that the FPCB 510 is the core part of the driver unit 120 in that the FPCB 510 contains key electronic components of the driver unit 120.

The rechargeable battery 410 is an internal battery used for providing a battery-supplied voltage 413. The rechargeable battery 410 may be a lithium-ion battery, which usually provides the battery-supplied voltage 413 of 3.7V. Preferably, the rechargeable battery 410 is also mounted on the FPCB 510. Additionally, the rechargeable battery 410 used in the driver unit 120 may be selected to be flexible. Details of flexible rechargeable batteries are available in the art, e.g., in U.S. Pat. No. 10,147,915. However, the present invention is not limited only to using a flexible rechargeable battery; the rechargeable battery 410 may be selected to be a rigid one provided that the rechargeable battery 410 does not occupy a large area on the driver unit 120 in order that the driver unit 120 is substantially flexible.

Since the MCU 430 generally requires a certain predetermined supply voltage, e.g., 3.3V, the power management module 460 is used for regulating the battery-supplied voltage 413 to a regulated voltage 463 usable for powering the MCU 430. The regulated voltage 463 may also be used for powering other functional modules in the driver unit 120.

The high-voltage booster module 420 is used for boosting up the regulated voltage 463 to yield a boosted voltage 423. Preferably, the route from the power management module 460 to the high-voltage booster module 420 is controlled by a MCU-controlled electronic switch 462. When the MCU 430 is started or restarted, the electronic switch 462 is disabled (OFF) at default settings to disconnect the high-voltage booster module 420 from the power management module 460, and is only enabled (ON) to provide the boosted voltage 423 when the MCU 430 receives a stimulation command. This arrangement is to prevent an unwanted electric shock to the user from occurring due to contact with a high voltage by accident when electrotactile stimulation is not yet applied.

Preferably, the high-voltage booster module 420 is implemented with two voltage boosting stages. The first stage is a medium-voltage booster 421, which boosts the regulated voltage 463 to a medium level, e.g., 12V. The second stage is a high-voltage booster 422, which boosts the medium-level voltage to a high voltage (which is the boosted voltage 423) for stimulation. The boosted voltage 423 may be up to 135V. The amplitude of the boosted voltage 423 is adjustable according to the need by changing the combination of two resistors in the high-voltage booster 422, and the boosted voltage 423, denoted as $V_{out}$, can be estimated by $$V_{out} = \left(\frac{R_1}{R_2} + 1\right) \times 1.6. \quad (1)$$

For example, when 90V is needed, set $R_1=1M\Omega$ and $R_2=18$ k$\Omega$, and the calculated voltage is $V_{out} \approx 90.5V$. Suppose that the highest excitation current needed for electrotactile stimulation is 5 mA. With the highest voltage of 135V, the excitation current can be adjusted within 5 mA freely if the resistive impedance of electrodes and human body is lower than 27 k$\Omega$. Since the resistive impedance of human body under high voltage is only several kilo-ohms, the boosted voltage 423 is sufficient only if the impedances of electrodes are of the same magnitude. The boosted voltage 423 is fed into the high-voltage MUX 425 to be further transformed into the plurality pulsed voltage signals 185, which can induce electrotactile sensations.

The high-voltage MUX 425 is used for controllably switching on and off the boosted voltage to generate the plurality of pulsed voltage signals 185 and hence yield the plurality of excitation currents 186. The generated plurality of excitation currents 186 is then sent to the electrode-array unit 110.

Preferably, the high-voltage MUX 425 is implemented as a high-voltage compatible multi-channel (e.g., 32-channel) analog switch, which can tolerate a differential input up to 200V. The high-voltage MUX 425 is controlled by the MCU 430, and transforms the boosted voltage 423 into an individual pulsed voltage signal 185a in the plurality of pulsed voltage signals 185 by switching a chosen channel at a certain frequency and a certain duty cycle. The channel that outputs the individual signal 185a is also addressable. Thus, the high-voltage MUX 425 plays a dual role of being a signal modulator and a channel selector simultaneously.

The MCU 430 is configured to at least control the high-voltage MUX 425 in switching the boosted voltage 423 for generating the individual pulsed voltage signal 185a with a desired pulse frequency and a desired duty cycle. Generally, the MCU 430 is further configured to control other electronic components of the driver unit 120, such as the electronic switch 462.

For enhancing safety operation of the apparatus 100, it is preferable that the driver unit 120 further includes a current control module 440 controllable by the MCU 430 for monitoring and limiting the return current 187 received by the common counter electrode 128 from the user to avoid the user from getting an electric shock. Specifically, the current control module 440 measures the return current 187 to yield a measurement result. The measurement result of the return current 187 is sent to the MCU 430. The MCU 430 compares the measurement value with a maximum current intensity that is considered safe to flow through a human body, e.g., 10 mA. If the measurement value exceeds the maximum current intensity, the MCU 430 shuts down the high-voltage booster module 420. The current control module 440 is mounted on the FPCB 510.

It is highly desirable for enhanced user convenience if the rechargeable battery 410 can be recharged when the user is wearing the apparatus 100 and is using the apparatus 100 in a VR/AR/XR application. Advantageously and preferably, the driver unit 120 further includes a wireless charging module 450 for charging the rechargeable battery 410. The wireless charging module 450 is configured to inductively generate a charging current from a time-varying magnetic field received from outside the driver unit 120 so as to receive the wireless power 182. The wireless charging module 450 includes a coil for coupling with the time-varying magnetic field. The wireless charging module 450 is mounted on the FPCB 510. The wireless charging module 450 may be implemented to be compliant to a QI wireless power transfer standard, which is a published protocol for realizing wireless power transfer.

Similar to other modules in the driver unit 120, the wireless charging module 450 is mounted on the FPCB 510. Since the time-varying magnetic field is energy-intensive, it is required to ensure that the wireless charging module 450 does not introduce intolerable EMI to other electronic components, especially the MCU 430, during simultaneous conversion of the time-varying magnetic field into a charging current and generation of the plurality of pulsed voltage signals 185. To avoid EMI, the apparatus 100 advantageously utilizes the flexibility offered by the FPCB 510. In the driver unit 120, preferably the FPCB 510 is folded to divide the FPCB 510 into a first FPCB portion 510a and a second FPCB portion 510b such that the wireless charging module 450 and the MCU 430 are located on the first FPCB portion 510a and the second FPCB portion 510b, respectively. The driver unit 120 further includes a magnetic shielding layer 520 sandwiched between the first FPCB portion 510a and the second FPCB portion 510b for reducing EMI generated by the wireless charging module 450 to the MCU 430 during recharging the rechargeable battery 410. As a result, it reduces the amount of EMI generated by the wireless charging module 450 to be undesirably received by the MCU 430. It is also preferable that the second FPCB portion 510b houses the wireless charging module 450 only while the first FPCB portion 510a houses remaining electronic components of the driver unit 120 so as to effectively utilize the magnetic shielding layer 520 to protect the remaining electronic components against possible EMI generated by the wireless charging module 450.

For wirelessly receiving electrostimulation commands from the external device 180, such as a mobile computing device or a computer, preferably the driver unit 120 further includes a wireless communication transceiver 435 for communicating with the external device 180. The wireless communication transceiver 435 is communicable with the MCU 430 for enabling the MCU 430 to communicate with the external device 180.

The wireless communication transceiver 435 may adopt one or more appropriate wireless communication protocols in communicating with the external device 180. One appropriate protocol is a specification in accordance with BLE. In certain embodiments, the wireless communication transceiver 435 is compliant to a BLE specification, allowing the external device 180 to wirelessly communicate with the driver unit 120 for a distance of up to 10 m based on the BLE wireless-communication protocol.

For miniaturization of the driver unit 120, preferably the MCU 430 is integrated with the wireless communication transceiver 435 to form a single package 438. If BLE is adopted by the wireless communication transceiver 435, the single package 438 is a BLE-enabled MCU if the wireless communication transceiver 435 adopts a BLE specification.

Refer to FIG. 5. In certain embodiments, the driver unit 120 further includes a silicone substrate layer 535 on which the FPCB 510 is positioned. The silicone substrate layer 535, which is electrically insulating and soft, has a function of separating the FPCB 510 from the hand 190 while contributing to the substantial flexibility of the driver unit 120. Note that the FPCB 510 is positioned on one side of the silicone substrate layer 535 while the common counter electrode 128, which is intended to contact the second area 320 of skin of the user, is fixed on another side of the silicone substrate layer 535.

The driver unit 120 may further include a silicone encapsulation layer 530 as a protective cover covering the FPCB 510. The silicone encapsulation layer 530, which is soft and electrically insulating, has a function of protecting the user from touching the internal electronics of the driver unit 120 while contributing to the substantial flexibility of the driver unit 120.

Note that the driver unit 120 can be implemented compactly as the functional modules therein can be highly integrated in integrated circuits and thereby can be made small. With a compact driver unit, miniaturization of the apparatus 100 is achievable, as demonstrated in FIGS. 2 and 3.

Figure 6:
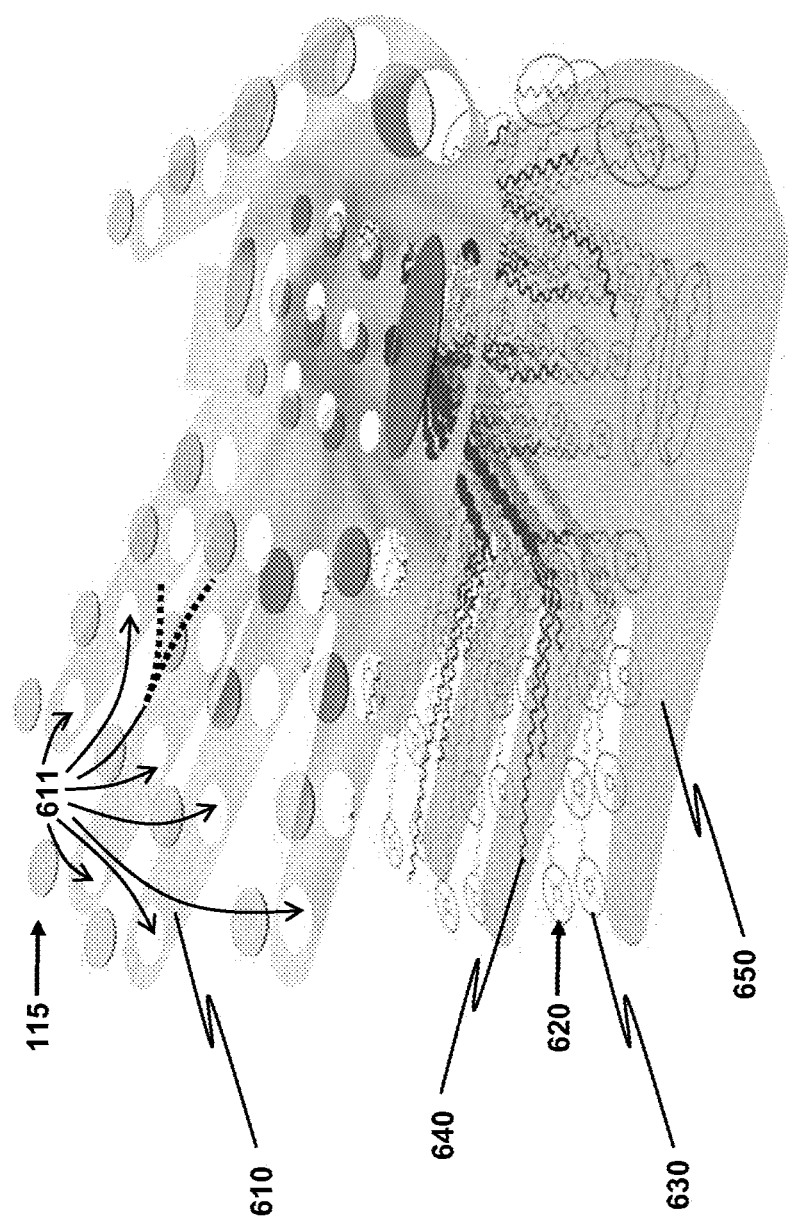
FIG. 6 depicts in exploded view a practical realization of the electrode-array unit in accordance with certain embodiments of the present invention.

Embodiments of the electrode-array unit 110 are illustrated with the aid of FIG. 6, which depicts a practical realization of the electrode-array unit 110 in exploded view according to certain embodiments of the present invention.

The electrode-array unit 110 as depicted in FIG. 6 has a layered structure, and is realized as a thin layer attachable to a palm of the hand 190. In addition to the plurality of electrodes 115, the electrode-array unit 110 further comprises an elastomer encapsulating layer 610, a protective layer 640, a plurality of conductive traces 620, a supporting layer 630, and an elastomer substrate layer 650.

In general, the electrode-array unit 110 can be made into various shapes with scalable form factors and spatial resolutions. According to the embodiment shown in FIG. 6, the electrode-array unit 110 is a hand-shaped patch with 115 electrodes distributed all over the first area 310 of skin (i.e. the palmar area) of the hand 190. With this patch attached to the palmar side of the hand 190, the user can perceive virtual touching feelings passively without actually touching anything, and can move freely to perform any gesture without feeling restricted, which is suitable for providing virtual touching feedbacks in AR or VR scenarios.

The elastomer encapsulating layer 610 is arranged to contact the first area 310 of skin and formed with a plurality of holes 611 for housing the plurality of electrodes 115. Positions of respective holes define locations of respective electrodes. Hence, the elastomer encapsulating layer 610 fixes the plurality of electrodes 115 to a plurality of preselected locations on the first area 310 of skin for carrying out electrostimulation. The elastomer encapsulating layer 610 is flexible, extensible and electrically insulating. The elastomer encapsulating layer 610, which is made of an elastomer, may be composed of silicone, rubber or other stretchable materials. It enables the electrode-array unit 110 to be flexible and extensible enough to attach tightly on the first area 310 of skin even under motion and deformation.

The plurality of conductive traces 620 is used for transmitting the plurality of pulsed voltage signals 185 from outside the electrode-array unit 110 to the plurality of electrodes 115. Respective conductive traces in the plurality of conductive traces 620 may be composed of metal, graphene, carbon nanotube or conductive polymer. The conductive polymer may be conductive hydrogel, PEDOT:PSS, silicone embedded with conductive materials, etc. The respective conductive traces are made into designed patterns of separated lines, for connecting the driver unit 120 and each electrode in different channels.

The supporting layer 630 and the protective layer 640 are both made of insulating materials, e.g., PI or parylene C, and are placed under and above the plurality of conductive traces 620, respectively. It follows that that plurality of conductive traces 620 is sandwiched between the supporting layer 630 and the protective layer 640. These two layers 630, 640 provide both mechanical stability support and electrical insulation, thereby preventing structure damage of the electrode-array unit 110 and current leakage. The protective layer 640 is positioned adjacent the elastomer encapsulating layer 610.

The respective electrodes in the plurality of electrodes 115 are placed on specified stimulation spots, which are connected with corresponding conductive traces, for applying directly on the skin surface and injecting excitation currents into human body. Preferably, an individual electrode is soft and stretchable, and is composed of an adhesive conductive polymer or an ionic gel, e.g., hydrogel made of LiCl contained PAAm. The plurality of electrodes 115 is preferred to be adhesive and humid so as to provide a better electrode-skin interface. Having a better electrode-skin interface reduces an impedance in the closed circuit traveled by the plurality of excitation currents 186, and prevent the user from getting a sudden decrease of contact area. The sudden decrease of contact area results in a sudden increase of local current density. It may lead to electric shock.

The elastomer substrate layer 650 forms a base for supporting the rest of the electrode-array unit 110. When the electrode-array unit 110 is put on the first area 310 of skin, the elastomer substrate layer 650 covers, and offers protection to, the rest of the electrode-array unit 110 (i.e. the elastomer encapsulating layer 610, the protective layer 640, the plurality of conductive traces 620 and the supporting layer 630). Similar to the elastomer encapsulating layer 610, the elastomer substrate layer 650 is flexible, extensible and electrically insulating. The elastomer substrate layer 650, which is made of an elastomer, may be composed of silicone, rubber or other stretchable materials. Note that the supporting layer 630 is positioned adjacent the elastomer substrate layer 650.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. An on-skin electrotactile apparatus for stimulating a first area of skin of a user to provide a haptic feedback to the user, the apparatus comprising:
   an electrode-array unit comprising a plurality of electrodes for electro-stimulating the first area of skin to generate the haptic feedback; and
   a driver unit configured to generate a plurality of pulsed voltage signals for driving the plurality of electrodes to thereby induce a plurality of excitation currents flowing into the user, the driver unit being further configured to be self-powered or wirelessly powered for avoiding installing an external electrical cable to draw in external electrical power to thereby support untethered electrotactile stimulation to the user, the driver unit including a common counter electrode arranged to contact a second area of skin of the user for collecting the plurality of excitation currents returned from the user, wherein the common counter electrode is located on an outer surface of the driver unit and the driver unit is largely able to bend without breaking, facilitating the common counter electrode to seamlessly contact the second area of skin for achieving a stable electrode-skin interface while positioning the driver unit as a whole on the second area of skin to provide untethered virtual touching experience to the user.

2. The apparatus of claim 1, wherein the driver unit further includes:
   a rechargeable battery for providing a battery-supplied electrical voltage;
   a power management module for regulating the battery-supplied electrical voltage to a regulated voltage;
   a high-voltage booster module for boosting up the regulated voltage to yield a boosted voltage;
   a high-voltage multiplexer (MUX) for controllably switching on and off the boosted voltage to generate the plurality of pulsed voltage signals;
   a microcontroller unit (MCU) configured to at least control the high-voltage MUX in switching the boosted voltage for generating an individual pulsed voltage signal with a desired pulse frequency and a desired duty cycle; and
   a flexible printed circuit board (FPCB) on which at least the power management module, the high-voltage booster module, high-voltage MUX and MCU are mounted.

3. The apparatus of claim 2, wherein the driver unit further includes:
   a wireless charging module for recharging the rechargeable battery, the wireless charging module being mounted on the FPCB.

4. The apparatus of claim 3, wherein the wireless charging module is compliant to a QI wireless power transfer standard.

5. The apparatus of claim 3, wherein:
   the FPCB is folded to divide the FPCB into a first FPCB portion and a second FPCB portion such that the wireless charging module and the MCU are located on the first FPCB portion and the second FPCB portion, respectively; and
   a magnetic shielding layer sandwiched between the first FPCB portion and the second FPCB portion for reducing magnetic-field interference generated by the wireless charging module to the MCU during recharging the rechargeable battery.

6. The apparatus of claim 2, wherein the rechargeable battery is mounted on the FPCB.

7. The apparatus of claim 2, wherein the rechargeable battery is flexible.

8. The apparatus of claim 2, wherein the driver unit further includes:
   a current control module controllable by the MCU for monitoring and limiting a return current received by the common counter electrode from the user to avoid the user from getting an electric shock, the return current being a sum of respective excitation currents in the plurality of excitation currents.

9. The apparatus of claim 2, wherein the driver unit further includes:
   a wireless communication transceiver for communicating with an external device, wherein the wireless communication transceiver is communicable with the MCU for enabling the MCU to communicate with the external device.

10. The apparatus of claim 9, wherein the wireless communication transceiver is compliant to a Bluetooth Low Energy (BLE) specification.

11. The apparatus of claim 10, wherein the MCU and the wireless communication transceiver are integrated into a single package.

12. The apparatus of claim 1, wherein the common counter electrode is a flexible patch composed of a conductive polymer.

13. The apparatus of claim 12, wherein the conductive polymer is conductive hydrogel, PEDOT:PSS (poly(3,4-ethylenedioxythiophene) polystyrene sulfonate), or silicone embedded with conductive materials.

14. The apparatus of claim 1 further comprising:
a multichannel connector arranged to connect the driver unit and the electrode-array unit for transmitting the plurality of pulsed voltage signals from the driver unit to the plurality of electrodes.

15. The apparatus of claim 1, wherein an individual electrode in the plurality of electrodes is soft and is composed of a conductive polymer.

16. The apparatus of claim 15, wherein the conductive polymer is conductive hydrogel, PEDOT:PSS (poly(3,4-ethylenedioxythiophene) polystyrene sulfonate), or silicone embedded with conductive materials.

17. The apparatus of claim 1, wherein the electrode-array unit further comprises:
an elastomer encapsulating layer arranged to contact the first area of skin and mounted with the plurality of electrodes for positioning the plurality of electrodes on a plurality of preselected locations of the first area of skin, wherein the elastomer encapsulating layer is flexible, extensible and electrically insulating;
a plurality of conductive traces for transmitting the plurality of pulsed voltage signals from outside the electrode-array unit to the plurality of electrodes;
a supporting layer and a protective layer positioned such that the plurality of conductive traces is sandwiched between the supporting layer and the protective layer, the protective layer being adjacent the elastomer encapsulating layer, both the supporting layer and the protective layer being electrically insulating; and
an elastomer substrate layer for offering protection to the elastomer encapsulating layer, the protective layer, the plurality of conductive traces and the supporting layer when the electrode-array unit is put on the first area of skin, wherein the supporting layer is positioned adjacent the elastomer substrate layer, and wherein the elastomer substrate layer is flexible, extensible and electrically insulating.

18. The apparatus of claim 17, wherein the elastomer encapsulating layer or elastomer substrate layer is composed of silicone, rubber or a stretchable material.

19. The apparatus of claim 17, wherein the plurality of conductive traces is composed of metal, graphene, carbon nanotube or conductive polymer.

20. The apparatus of claim 17, wherein the supporting layer and protective layers are made of polyimide (PI) or parylene C.

* * * * *